(12) United States Patent
Runyan

(10) Patent No.: US 11,562,955 B2
(45) Date of Patent: Jan. 24, 2023

(54) HIGH DENSITY MULTIPLE DIE STRUCTURE

(71) Applicant: Intel Corporation, Santa Clara, CA (US)

(72) Inventor: Cory A. Runyan, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 603 days.

(21) Appl. No.: 16/088,340

(22) PCT Filed: Apr. 27, 2016

(86) PCT No.: PCT/US2016/029563
§ 371 (c)(1),
(2) Date: Sep. 25, 2018

(87) PCT Pub. No.: WO2017/188944
PCT Pub. Date: Nov. 2, 2017

(65) Prior Publication Data
US 2020/0303297 A1    Sep. 24, 2020

(51) Int. Cl.
*H01L 25/065* (2006.01)
*H01L 23/522* (2006.01)
*H01L 23/49* (2006.01)

(52) U.S. Cl.
CPC .......... *H01L 23/5226* (2013.01); *H01L 23/49* (2013.01); *H01L 25/0657* (2013.01); *H01L 2224/16227* (2013.01)

(58) Field of Classification Search
CPC ............. H01L 25/0657; H01L 23/5226; H01L 2224/16227; H01L 2924/181; H01L 23/49816; H01L 2924/1434; H01L 2225/0651; H01L 2224/48227; H01L 2224/32145; H01L 2224/48145; H01L 2924/15311; H01L 2224/73265

See application file for complete search history.

(56) References Cited

U.S. PATENT DOCUMENTS

| 7,528,474 | B2 | 5/2009 | Lee |
| 9,646,922 | B2 * | 5/2017 | Wu ........................ H01L 25/105 |
| 10,297,582 | B2 * | 5/2019 | Caskey ............... H01L 23/3114 |

(Continued)

OTHER PUBLICATIONS

"International Application Serial No. PCT US2016 029563, International Preliminary Report on Patentability dated Nov. 8, 2018", 11 pgs.

(Continued)

*Primary Examiner* — Thanh Y. Tran
(74) *Attorney, Agent, or Firm* — Schwegman Lundberg & Woessner, P.A.

(57) ABSTRACT

Apparatus and methods are provided for integrated circuit packages having a low z-height. In an example, a method can include mounting a first integrated circuit sub-package to a first package substrate wherein the sub-package substrate spans an opening of the first package substrate, mounting a second integrated circuit package to a second package substrate, and mounting the first package substrate with the second package substrate wherein the mounting includes locating a portion of the second integrated circuit package within the opening of the first package substrate.

14 Claims, 7 Drawing Sheets

(56) References Cited

U.S. PATENT DOCUMENTS

| | | | |
|---|---|---|---|
| 2005/0230799 A1* | 10/2005 | Kang | H05K 1/141 |
| | | | 257/684 |
| 2006/0110849 A1* | 5/2006 | Lee | H01L 25/105 |
| | | | 438/106 |
| 2007/0216008 A1* | 9/2007 | Gerber | H01L 25/0657 |
| | | | 257/E25.023 |
| 2007/0290319 A1 | 12/2007 | Kim | |
| 2008/0001266 A1* | 1/2008 | Yu | H01L 25/50 |
| | | | 257/678 |
| 2008/0111224 A1 | 5/2008 | Byun et al. | |
| 2009/0020885 A1 | 1/2009 | Onodera | |
| 2009/0179319 A1* | 7/2009 | Lee | H01L 24/83 |
| | | | 257/686 |
| 2013/0157413 A1* | 6/2013 | Upadhyayula | H01L 24/83 |
| | | | 438/108 |
| 2014/0291840 A1 | 10/2014 | Bae et al. | |
| 2016/0192525 A1* | 6/2016 | Hu | H01L 25/0657 |
| | | | 361/736 |

OTHER PUBLICATIONS

"International Application Serial No. PCT/US2016/029563, International Search Report dated Dec. 8, 2016", 3 pgs.
"International Application Serial No. PCT/US2016/029563, Written Opinion dated Dec. 8, 2016", 9 pgs.

\* cited by examiner

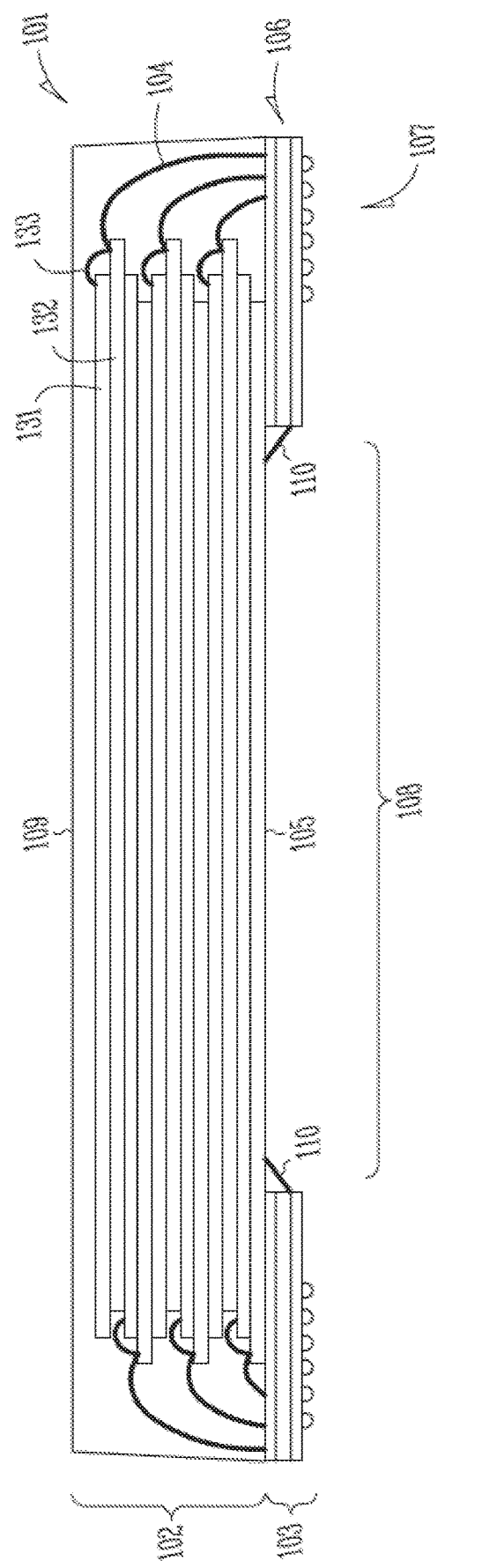

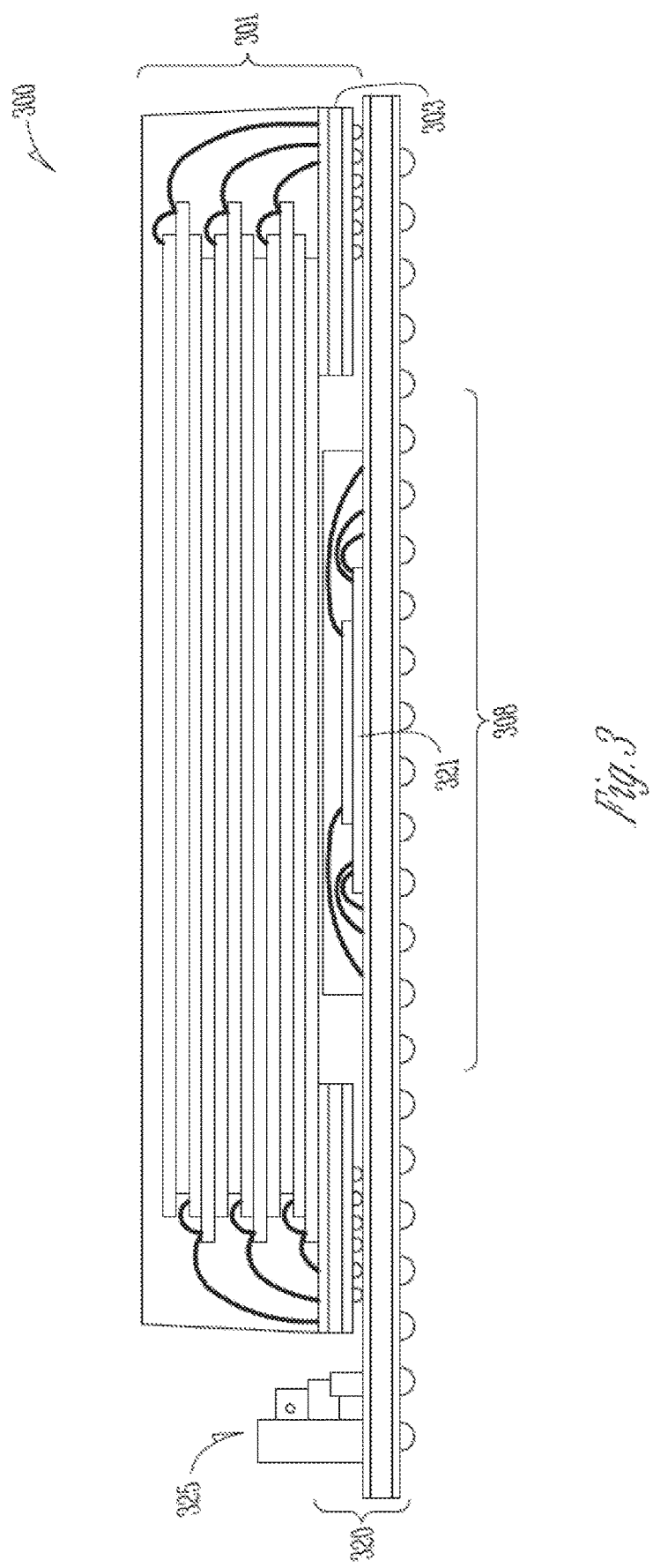

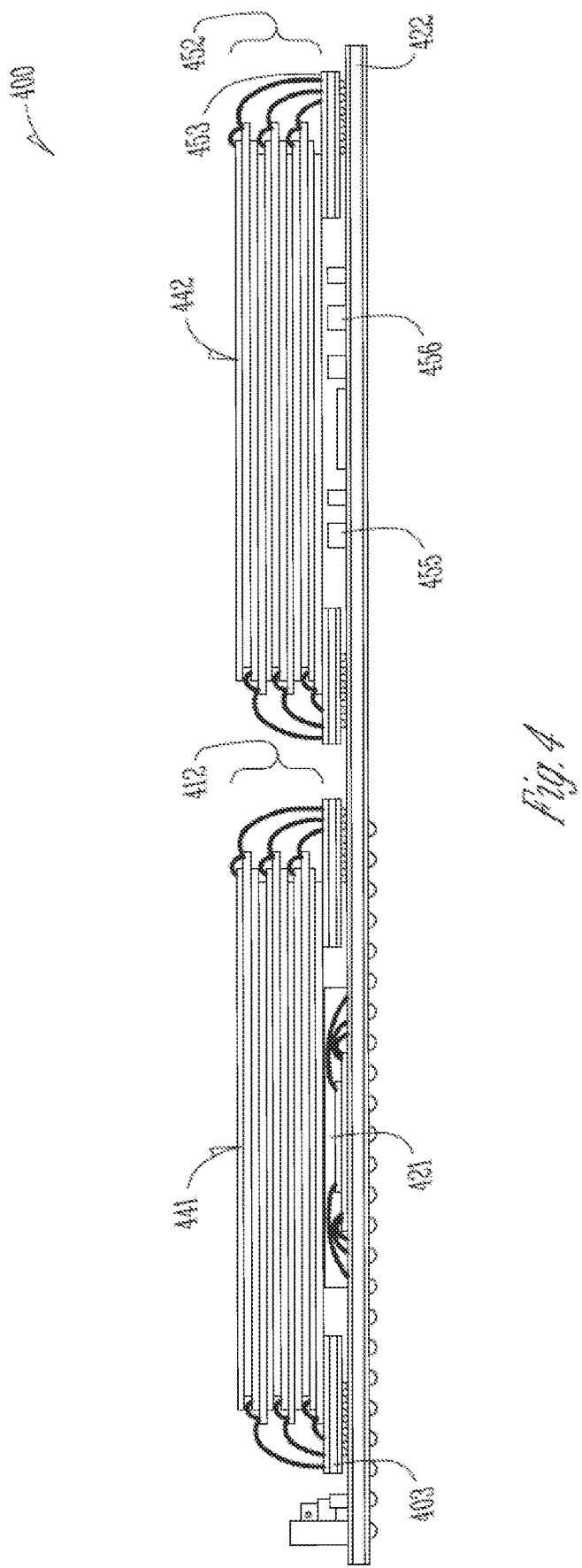

HIGH DENSITY MULTIPLE DIE STRUCTURE

This application is a U.S. National Stage Filing under 35 U.S.C. 371 from International Application No. PCT/US2016/029563, filed Apr. 27, 2016 and published in English as WO 2017/188944 on Nov. 2, 2017, which is incorporated herein by reference in its entirety.

TECHNICAL FIELD

The disclosure herein relates generally to integrated circuit packages and more particularly to apparatus and methods for dense stacking of integrated circuits in an integrated circuit package.

BACKGROUND

The latest model electronic products such as mobile phones, mobile computing, and various consumer products continue to value miniaturization. previous miniaturization efforts have reduced the size of the individual electronic sub-components. Additional space saving techniques can provide a competitive advantage to providing small or more capable electronic products consumers like to purchase.

BRIEF DESCRIPTION OF THE DRAWINGS

In the drawings, which are not necessarily drawn to scale, like numerals may describe similar components in different views. Like numerals having different letter suffixes may represent different instances of similar components. Some embodiments are illustrated by way of example, and not limitation, in the figures of the accompanying drawings in which:

FIGS. 1A and 1B illustrate generally an upper package of a stacked integrated circuit package according to an example of the present subject matter.

FIG. 3 illustrates generally a cross section view of an integrated circuit package that includes an upper package and a lower package.

FIG. 4 illustrates generally an integrated circuit package including a pair of stacked packages with low z-height.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1B:
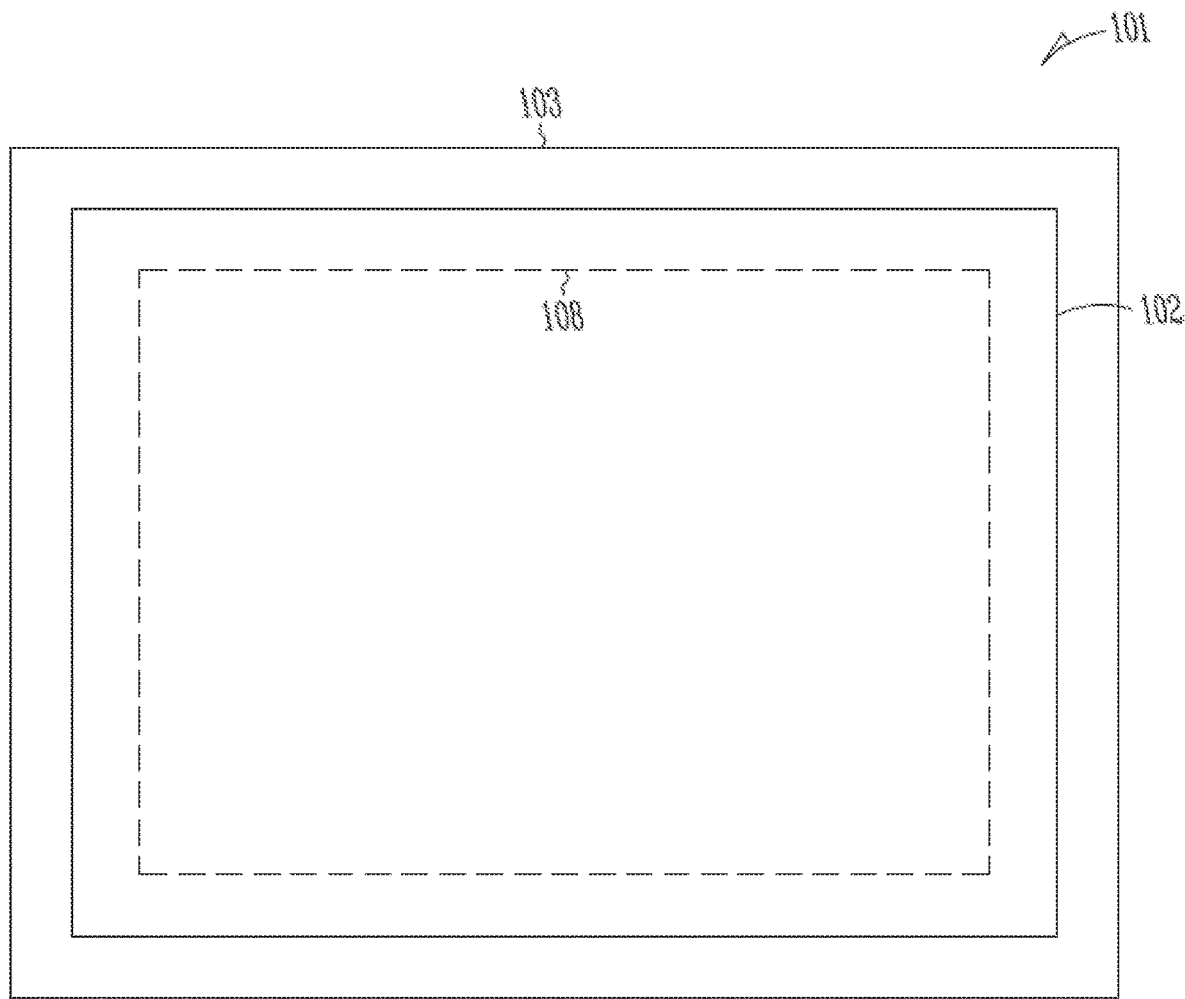

FIGS. 1A and 1B illustrate generally an upper package 101 of a stacked integrated circuit package according to an example of the present subject matter. The upper package 101 can include one or more integrated circuits 102 stacked on each other and a frame-shaped, upper package substrate 103. In some examples, the one or more integrated circuits 102 can include one or more integrated circuit packages. In some examples, the one or more integrated circuits 102 can include memory circuits including but not limited to non-volatile memory circuits. In some examples, the one or more integrated circuits 102 can be electrically coupled to terminals of the upper package substrate 103 by wire bonds 104. In some examples, the one or more integrated circuits 102 can be electrically coupled to terminals of the upper package substrate 103 using through silicon vias (TSVs). In some examples, the integrated circuit 105 of the upper package 101 located adjacent the upper package substrate 103 can be electrically coupled to terminals of the upper package substrate 103 using solder or solder balls. In certain examples, electrical signals can be exchanged between the upper package substrate 103 and the one or more integrated circuits 102 of the upper package 101 using wire bonds 104, TSVs, solder, solder balls or combinations thereof.

In certain examples, the upper package substrate 103 of the upper package 101 can include a first set of terminations 106 for electrically connecting to the one or more integrated circuits 102 and a second set of terminations 107 for electrically connecting the upper package 101, and more specifically, the upper package substrate 103 to a lower package 220. In certain examples, the upper package substrate 103 can include multiple layers. In some examples, certain layers of the upper package substrate 103 can include electrical traces for routing electrical connections between the first set of terminations 106 and the second set of terminations 107.

In certain example, the upper package substrate 103 includes an opening 108. In some examples, the upper package substrate 103 can define the entire exterior of the opening 108. In some examples, the upper package substrate 103 can define a portion of the exterior of the opening 108.

In certain examples, upon assembly of the one or more integrated circuits 102 with the upper package substrate 103, additional materials can be added to protect the electronics of the upper package 101 and to assist in coupling the one or more integrated circuits 102 with the upper package substrate 103. In certain examples, the upper package 101 can include an overmold 109 to protect both the one or more integrated circuits 102 and portions of the upper package substrate 103 not covered by the one or more integrated circuits 102. In addition, the overmold 109 can assist in the mechanical coupling of the one or more integrated circuits 102 with the upper package substrate 103.

In certain examples, the upper package 101 can include an adhesive 110 applied to an interface of an underside of the lower most integrated circuit 105 and the upper package substrate 103 where the interface is located at an exterior limit of the opening 108 defined by the upper package substrate 103. The application of the adhesive 110 can be such that the adhesive 110 contacts both the integrated circuit 105 and the upper package substrate 103 in the immediate location of the interface. In some examples, the application of the adhesive 110 can include one or more dabs. In some examples, the application of the adhesive 110 can include a bead of adhesive 110 along at least a portion of the interface.

In certain examples, the stack of integrated circuits 102 can include individual integrated circuit sub-packages that can include a pair of integrated circuit dies or an integrated circuit die and a sub-package substrate. The two components 131, 132 making up each individual integrated circuit sub-package can be stacked with at least one edge offset. When stacked together, the upper component 131 can have a wire bond 133 to the lower component 132. As the individual integrated circuit sub-packages are stacked together on the upper package substrate 103, wire bonds 104 can be assembled between the lower component 132 of the individual integrated circuit sub-package and the upper package substrate 103. In certain examples, the wire bonds 104 for a given individual integrated circuit package are assembled to the upper package substrate 103 before the next individual integrated circuit sub-package is added to the stack because the next integrated circuit sub-package can limit accessibility to the wire bond area of the individual integrated circuit sub-package stacked below it.

FIG. 1A illustrates generally a cross section of the upper package 101 through the opening 108 defined by the upper package substrate 103. FIG. 1B illustrates generally a top view of the upper package 101 of FIG. 1A with the opening 108 under the one or more integrated circuits 102 shown in ghost lines. It is understood that opening shapes other than a rectangle are possible for the upper package substrate 103 without departing from the scope of the present subject matter.

Figure 2A:
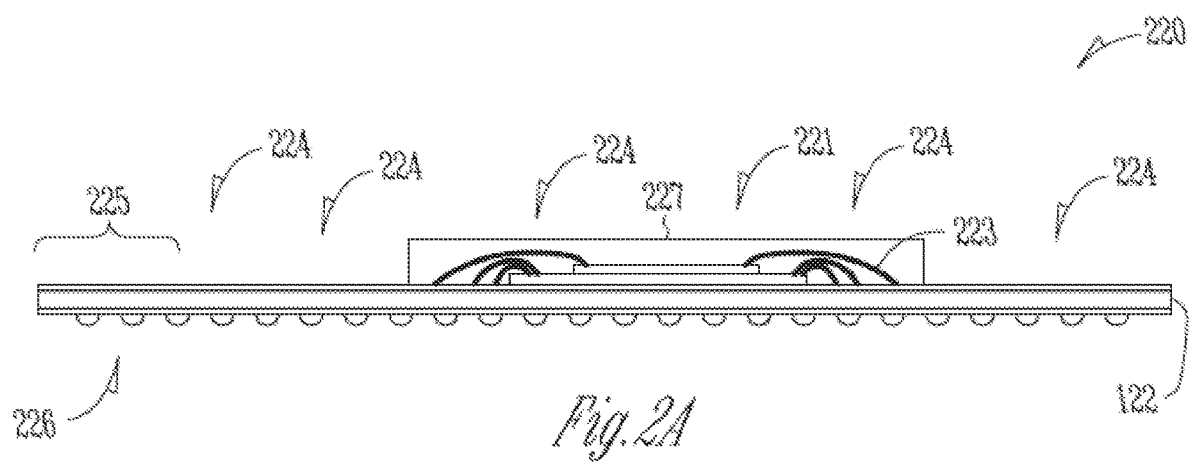
FIGS. 2A and 2B illustrate general a lower package of a stacked integrated circuit package according to an example of the present subject matter.
Figure 2B:
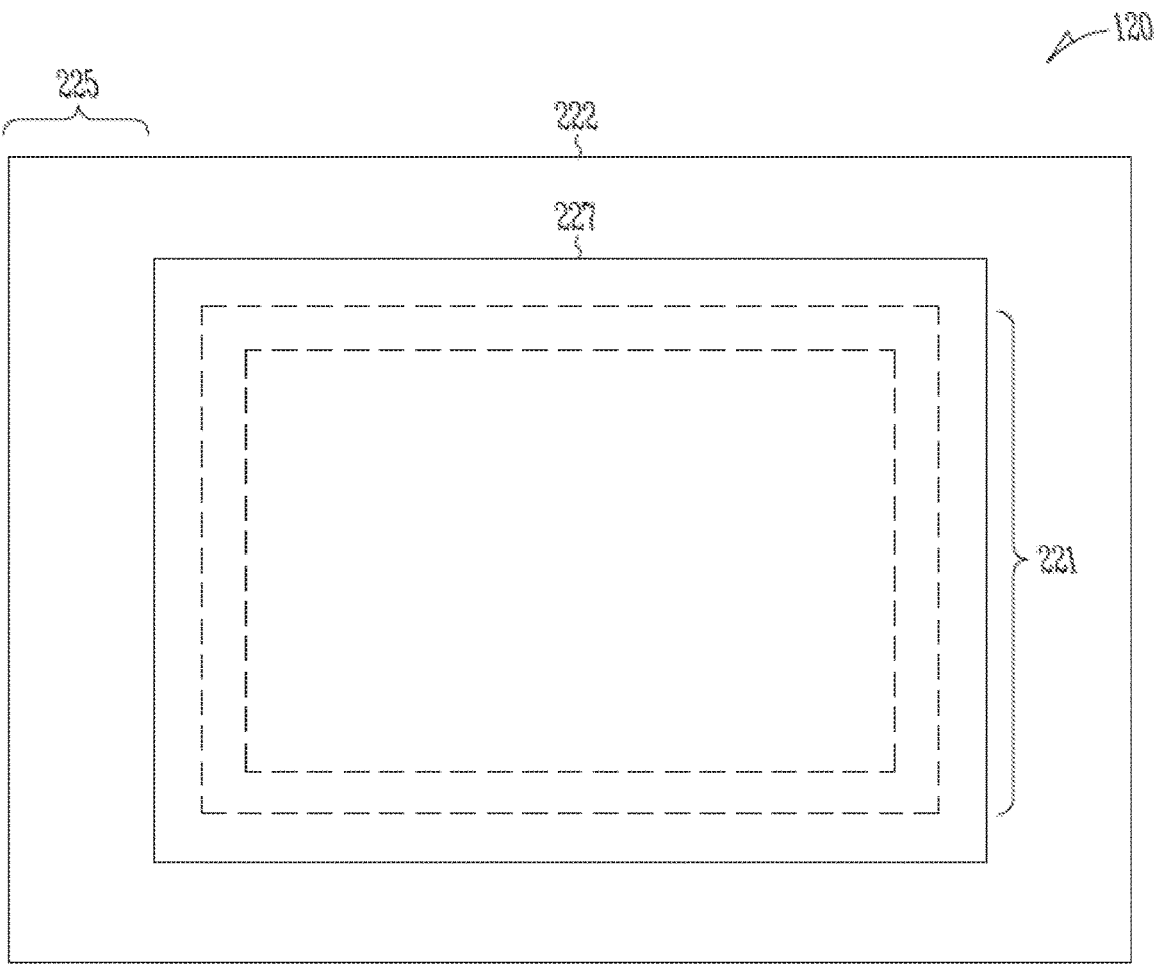

FIGS. 2A and 2B illustrate general a lower package 220 of a stacked integrated circuit package according to an example of the present subject matter. The lower package 220 includes one or more integrated circuits 221 mounted on a lower package substrate 222. In the illustrated examples, the one or more integrated circuits 221 of the lower package 220 are shown stacked, however, other orientations of the integrated circuits 221 are possible without departing from the scope of the present subject matter. In certain examples, the one or more integrated circuits 221 of the lower package 220 can be electrically connected to the lower package substrate 222 using wire bonds, TSVs, solder, solder balls, or combination thereof. In certain examples, the one or more integrated circuits 221 can include, but are not limited to, an application specific integrated circuit (ASIC), a processor, memory chips such as, but not limited to, volatile memory chips, interface chips, or combinations thereof.

In certain examples, the lower package substrate 222 can include top-side terminations 224 for mounting the integrated circuits 221 of the lower package 220, mounting an upper package, and mounting additional electronic circuit elements 225. The lower package substrate 222 can also include bottom-side terminations 226 for electrically connecting the package to other components of a system. In certain examples, the lower package substrate 222 can include more than one layer. In some examples, certain layers of the lower package substrate 222 can include electrical traces for routing electrical connections between the top-side terminations 224 and the bottom-side terminations 226. In some examples, the lower package 220 can include material 227, such as an overmold, to encapsulate the integrated circuits 221 of the lower package 220. Such material 227 can provide physical isolation and electrical isolation of exposed surfaces of the mounted integrated circuits 221 and the immediately adjacent surface of the lower package substrate 222.

FIG. 2A illustrates generally a cross section of the lower package 220. FIG. 2B illustrates generally a top-down view of the lower package 220 of FIG. 2A. It is understood that shape and layout of the lower package 220 can be different than that shown in FIGS. 2A and 2B without departing from the scope of the present subject matter.

FIG. 3 illustrates generally a cross section view of an integrated circuit package 300 that includes an upper package 301 (e.g., the upper package 101 of FIGS. 1A and 1B) and a lower package 320 (e.g., the lower package of FIGS. 2A and 2B). In certain examples, the integrated circuits 321 of the lower package 320 can interface within an opening 308 of the upper package substrate 303 to allow for a compact and space efficient integrated circuit package 300. Existing multi-package systems can include an upper package substrate without an opening that when assembled occupies more height in order fully accommodate the underlying integrated circuits of the lower package. As a result, the nesting of the integrated circuits 321 of the lower package 320 within an opening 308 of the upper package substrate 303 can provide a high-density, package-on-package configuration with low vertical or low Z-height. In certain examples, the nesting feature of the present subject matter can be well suited for storage systems containing a multi-die memory stack and an ASIC memory controller. Such storage systems can contain from 4 to 16 NAND memory dies, an ASIC memory controller, volatile memory and possibly other integrated circuit chips and passive components. In some examples, the lower package substrate can include an area 325 for additional component mounting, including components with a high z-height.

FIG. 4 illustrates generally an integrated circuit package 400 including a pair of stacked packages 441, 442 with low z-height. A first stacked package 441 includes an upper substrate 403 with a first stack of integrated circuits 402 configured to stack in a low z-height configuration above a lower stack of integrated circuits 421. A second stacked package 442 includes an upper substrate 453 with an upper stack of integrated circuits 452 configured to stack in a low z-height arrangement above a number of individual passive components 455, a number of individual active components 456, or a number of individual passive components 455 and a number of individual active components 456. Each of the upper substrates 403, 453 can be mounted to a single lower package substrate 422.

Figure 5:
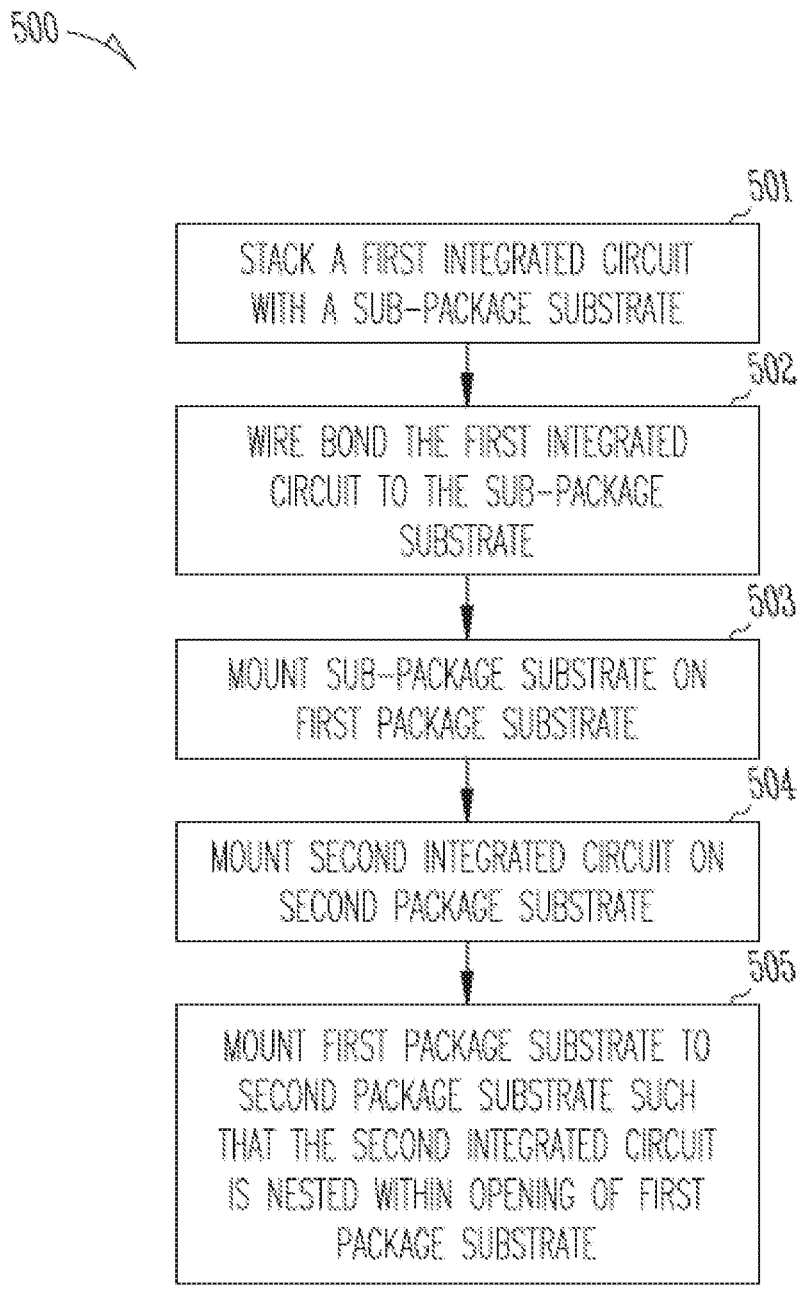
FIG. 5 illustrates generally a flowchart of a method for forming a low z-height package-on-package integrated circuit package.

FIG. 5 illustrates generally a flowchart of an example method 500 for forming a low z-height package-on-package integrated circuit package. At 501, a first integrated circuit can be mounted to a sub-package substrate. In certain examples, an edge of the first integrated circuit can be stacked offset from an edge of the sub-package substrate to allow for wire bond connections. At 502, the terminations of the integrated circuit can be wire-bonded to terminations of the sub-package substrate to form a first integrated circuit sub-package. In certain examples, additional integrated circuit sub-packages can be formed and wire bonds can be connected between the individual components of each sub-package. At 503, a first integrated circuit sub-package can be mounted to a first package substrate to form a first integrated circuit package. The first package substrate can include an opening. The opening is relatively large and on the order of a footprint of an integrated circuit. The opening is much larger than, for example, a connection via of a substrate. In certain examples, additional integrated circuit sub-packages can be stacked atop the first integrated circuit sub-package. In some examples, wire bonds between the sub-package substrate and the first package substrate are completed before an additional integrated circuit sub-package is added atop the first integrated circuit sub-package. At 504, a second integrated circuit or integrated circuit sub-package can be mounted to a second package substrate. The second integrated circuit or integrated circuit sub-package can include a stack of integrated circuits in certain examples. At 505, the first package substrate can be mounted to the second package substrate such that the second integrated circuit is positioned within, or nested within, the opening of the first package substrate. Such nesting can allow a package-on-package integrated circuit package to provide the same functionality of existing package on package system with reduced physical height.

Figure 6:
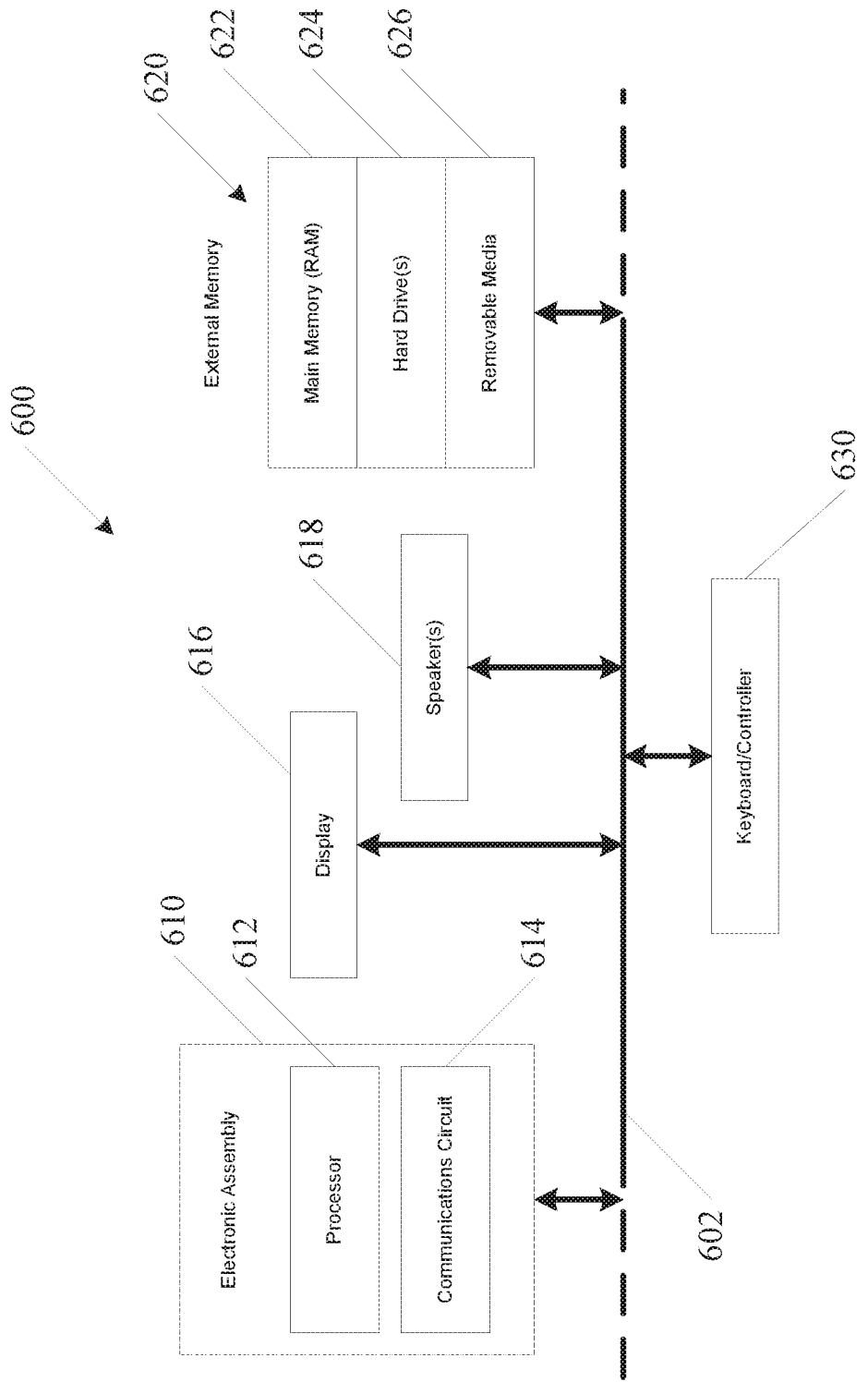
FIG. 6 is a block diagram of an electronic device 600 incorporating at least one integrated circuit package in accordance with at least one embodiment of the subject matter.

An example of an electronic device using semiconductor chip assemblies and solders as described in the present disclosure is included to show an example of a higher level device application for the present subject matter. FIG. 6 is a block diagram of an electronic device 600 incorporating at least one integrated circuit package in accordance with at least one embodiment of the subject matter. Electronic device 600 is merely one example of an electronic system in which embodiments of the present subject matter can be used. Examples of electronic devices 600 include, but are not limited to personal computers, tablet computers, mobile telephones, game devices, MP3 or other digital music players, etc. In this example, electronic device 600 comprises a data processing system that includes a system bus 602 to couple the various components of the system. System bus 602 provides communications links among the various components of the electronic device 600 and can be implemented as a single bus, as a combination of busses, or in any other suitable manner.

An electronic assembly 610 is coupled to system bus 602. The electronic assembly 610 can include any circuit or combination of circuits. In one embodiment, the electronic assembly 610 includes a processor 612 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that can be included in electronic assembly 610 are a custom circuit, an application-specific integrated circuit (ASIC), or the like, such as, for example, one or more circuits (such as a communications circuit 614) for use in wireless devices like mobile telephones, personal data assistants, portable computers, two-way radios, and similar electronic systems. The IC can perform any other type of function.

The electronic device 600 can also include an external memory 620, which in turn can include one or more memory elements suitable to the particular application, such as a main memory 622 in the form of random access memory (RAM), one or more hard drives 624, and/or one or more drives that handle removable media 626 such as compact disks (CD), flash memory cards, digital video disk (DVD), and the like.

The electronic device 600 can also include a display device 616, one or more speakers 618, and a keyboard and/or controller 630, which can include a mouse, trackball, touch screen, voice-recognition device, or any other device that permits a system user to input information into and receive information from the electronic device 600.

ADDITIONAL EXAMPLES AND NOTES

In Example 1, an integrated circuit package system can include a first substrate having an opening, a first integrated circuit package mounted on the first substrate and configured to span the opening and define a volume, a second substrate, a second integrated circuit memory package mounted to the second substrate, wherein the first substrate is mounted to the second substrate, wherein the second integrated memory circuit package is configured to occupy at least a portion of the volume, and wherein the first integrated circuit package includes one or more sub-packages, each sub-package including a first integrated circuit stacked with a sub-package substrate, and a first plurality of wire bonds electrically coupling the first integrated circuit package with the sub-package substrate.

In Example 2, the sub-package substrate of Example 1 optionally includes a second integrated circuit.

In Example 3, the first integrated circuit package of any one or more of Examples 1-2 optionally includes a stack of non-volatile memory dies.

In Example 4, the second integrated circuit package of any one or more of Examples 1-3 optionally includes a second stack of integrated circuit dies.

In Example 5, the second stack of integrated circuit dies of any one or more of Examples 1-4 optionally includes a volatile memory die.

In Example 6, the second stack of integrated circuit dies of any one or more of Examples 1-5 optionally includes an application specific integrated circuit (ASIC).

In Example 7, the integrated circuit package system of any one or more of Examples 1-6 optionally includes an adhesive configured to secure the first integrated circuit package with the first substrate, wherein at least a portion of the adhesive is located at an interface of the opening and an underside of the first integrated circuit package.

In Example 8, the integrated circuit package system of any one or more of Examples 1-7 optionally includes a first overmold configured to encapsulated the first integrated circuit package and a top surface of the first substrate.

In Example 9, the first overmold of any one or more of Examples 1-8 optionally is configured to encapsulated first wire bonds electrically connecting the first integrated circuit package with the first substrate.

In Example 10, the integrated circuit package system of any one or more of Examples 1-9 optionally includes a second overmold configured to encapsulated the second integrated circuit package and at least a portion of a top surface of the second substrate.

In Example 11, the second overmold of any one or more of Examples 1-10 optionally is configured to encapsulated second wire bonds electrically connecting the second integrated circuit package with the second substrate.

In Example 12, an electronic package can include a first substrate, a first integrated circuit package mounted on the first substrate, a second substrate mounted on the first substrate, the second substrate including an opening configured to surround the first integrated circuit package when the second substrate is mounted to the first substrate, a second integrated circuit package mounted on the second substrate, the second integrated circuit package configured to span the opening, and wherein the second integrated circuit package includes one or more sub-packages, each sub-package including a first integrated circuit stacked with a sub-package substrate, and a first plurality of wire bonds electrically coupling the first integrated circuit package with the sub-package substrate.

In Example 13, the first integrated circuit package of any one or more of Examples 1-12 optionally includes a first stack of integrated circuit dies.

In Example 14, the first stack of integrated circuit dies of any one or more of Examples 1-13 optionally includes a volatile memory die.

In Example 15, the first stack of integrated circuit dies of any one or more of Examples 1-14 optionally includes an application specific integrated circuit (ASIC).

In Example 16, the sub-package substrate of any one or more of Examples 1-15 optionally includes a second integrated circuit.

In Example, 17, the second integrated circuit package of any one or more of Examples 1-16 optionally includes a stack of non-volatile memory dies.

In Example 18, the electronic package of any one or more of Examples 1-17 optionally includes an adhesive configured to secure the second integrated circuit package with the second substrate, wherein at least a portion of the adhesive is located at an interface of the opening and an underside of the second integrated circuit package.

In Example 19, a method an include stacking a first integrated circuit with a sub-package substrate to provide a first integrated circuit sub-package, wire bonding the first integrated circuit to the sub-package substrate, mounting the first integrated circuit sub-package to a first package substrate wherein the sub-package substrate spans an opening of the first package substrate, mounting a second integrated circuit package to a second package substrate, and mounting the first package substrate with the second package substrate wherein the mounting includes locating a portion of the second integrated circuit package within the opening of the first package substrate.

In Example 20, the mounting the first integrated circuit sub-package to the first package substrate of any one or more of Examples 1-19 optionally includes applying an adhesive to an interface of the opening and an underside of the sub-package substrate.

In Example 21, the mounting the first integrated circuit sub-package to the first package substrate of any one or more of Examples 1-20 optionally includes encapsulating the first integrated circuit sub-package and a top surface of the first integrated circuit substrate with a first overmold, and the mounting the second integrated circuit package to the second package substrate of any one or more of Examples 1-20 optionally includes encapsulating the second integrated circuit and at least a portion of a top surface of the second substrate with a second overmold.

Each of these non-limiting examples can stand on its own, or can be combined with one or more of the other examples in any permutation or combination.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are legally entitled.

What is claimed is:

1. An integrated circuit package system comprising:
   a first substrate having an opening;
   a first integrated circuit package including one or more first dies forming a direct interface with the first substrate and configured to span the opening and define a volume;
   a second substrate;
   a second integrated circuit memory package mounted to the second substrate;
   wherein the first substrate is mounted to the second substrate, wherein the second substrate is dimensioned larger than the opening;
   wherein the second integrated circuit memory package is configured to occupy at least a portion of the volume;
   wherein the first integrated circuit package includes a first plurality of wire bonds electrically coupling the one or more first dies with the first substrate; and
   an adhesive configured to secure the first integrated circuit package with the first substrate, wherein at least a portion of the adhesive is located at an interface of the opening and an underside of the first integrated circuit package.

2. The integrated circuit package system of claim 1, wherein the first integrated circuit package includes a stack of non-volatile memory dies.

3. The integrated circuit package system of claim 1, wherein the second integrated circuit package includes a second stack of integrated circuit dies.

4. The integrated circuit package system of claim 3, wherein the second stack of integrated circuit dies includes a volatile memory die.

5. The integrated circuit package system of claim 3, wherein the second stack of integrated circuit dies includes an application specific integrated circuit (ASIC).

6. The integrated circuit package system of claim 1, including a first overmold configured to encapsulate the first integrated circuit package and a top surface of the first substrate.

7. The integrated circuit package system of claim 6, wherein the first overmold is configured to encapsulate first wire bonds electrically connecting the first integrated circuit package with the first substrate.

8. The integrated circuit package system of claim 6, including a second overmold configured to encapsulate the second integrated circuit package and at least a portion of a top surface of the second substrate.

9. The integrated circuit package system of claim 8, wherein the second overmold is configured to encapsulate second wire bonds electrically connecting the second integrated circuit package with the second substrate.

10. An electronic package comprising:
 a first substrate;
 a first integrated circuit package mounted on the first substrate;
 a second substrate mounted on a periphery of the first substrate, the second substrate including an opening configured to surround the first integrated circuit package when the second substrate is mounted to the first substrate;
 a second integrated circuit package including one or more dies forming a direct interface with the second substrate, the second integrated circuit package configured to span the opening;
 wherein the second integrated circuit package includes a plurality of wire bonds electrically coupling the one or more dies to the second substrate; and
 an adhesive configured to secure the first integrated circuit package with the first substrate, wherein at least a portion of the adhesive is located at an interface of the opening and an underside of the first integrated circuit package.

11. The electronic package of claim 10, wherein the first integrated circuit package includes a first stack of integrated circuit dies.

12. The electronic package system of claim 11, wherein the first stack of integrated circuit dies includes a volatile memory die.

13. The electronic package system of claim 12, wherein the first stack of integrated circuit dies includes an application specific integrated circuit (ASIC).

14. The electronic package system of claim 10, wherein the second integrated circuit package includes a stack of non-volatile memory dies.

* * * * *